United States Patent [19]

Bose et al.

[11] Patent Number: 4,628,528

[45] Date of Patent: Dec. 9, 1986

[54] PRESSURE WAVE TRANSDUCING

[75] Inventors: Amar G. Bose, Wayland; William R. Short, Wellesley, both of Mass.

[73] Assignee: Bose Corporation, Framingham, Mass.

[21] Appl. No.: 427,785

[22] Filed: Sep. 29, 1982

[51] Int. Cl.[4] .......................... H04R 1/28; H04R 1/02; H03G 3/00

[52] U.S. Cl. .......................................... 381/90; 181/145; 367/137; 367/188; 381/64; 381/115; 381/117; 381/154

[58] Field of Search ........................ 381/90, 56, 59, 64, 381/103, 117, 115; 179/178, 179, 146 E; 181/145; 367/188, 189, 137, 138

[56] References Cited

U.S. PATENT DOCUMENTS

| | | | |
|---|---|---|---|
| 2,031,500 | 2/1936 | Olney . | |
| 2,277,525 | 3/1942 | Mercurius | 181/156 |
| 2,646,852 | 7/1953 | Forrester | 181/156 |
| 2,812,033 | 11/1957 | Young | 181/171 |
| 2,816,619 | 12/1957 | Karlson | 181/148 |
| 2.852,087 | 9/1958 | Ruschhaupt | 181/151 |
| 3,122,215 | 2/1964 | Sutton | 181/160 |
| 3,327,808 | 6/1967 | Shaper | 181/153 |
| 3,523,589 | 8/1970 | Virva | 181/151 |
| 3,529,691 | 9/1970 | Wesemann | 181/156 |
| 3,755,749 | 8/1973 | VanRyswky et al. | 381/103 |
| 4,007,434 | 2/1977 | Fletcher | 333/174 |
| 4,168,761 | 9/1979 | Pappanikolaou | 181/156 |

FOREIGN PATENT DOCUMENTS

| | | | |
|---|---|---|---|
| 2854899 | 7/1980 | Fed. Rep. of Germany | 381/59 |
| 58-121895 | 8/1983 | Japan | 179/179 |

OTHER PUBLICATIONS

"Big Bass from a Little Box", *Popular Science*, Apr. 1985, pp. 86+.

"Speakerlab Technical Compendium and Hot News Gazette", by Pat Snyder, pp. 1-23.

"Transmission Line Speakers", Sound, pp. 61-65, 83.

"Analysis of a Low-Frequency Loudspeaker System", by Peter W. Tappan, Journal of the Audio Engineering Society, Jan. 1959, vol. 7, No. 1, pp. 38-46.

"A Non-resonant Loudspeaker Enclosure Design", by A. R. Bailey, Wireless World, Oct. 1965, pp. 1-4.

"Hi-Fi MiniSpeaker", by George Pappanikolaou, Radio Electronics, 12/81, pp. 61-69, 106.

*Primary Examiner*—Gene Z. Rubinson
*Assistant Examiner*—Danita R. Byrd
*Attorney, Agent, or Firm*—Charles Hieken

[57] ABSTRACT

A loudspeaker driver has its front surface adjacent one end of a low loss acoustic waveguide and its rear surface adjacent to one end of a second acoustic waveguide that is one third the length of the first. The other openings of the waveguides face air and couple acoustical energy substantially uniformly over a relatively broad range of frequencies extenting into the bass frequency region. An equalizer includes a notch filter so that the frequency response of the equalizer below a bass cutoff frequency is sufficiently low to prevent audible distortion.

41 Claims, 11 Drawing Figures

PRESSURE WAVE TRANSDUCING

The present invention relates in general to pressure wave transducing and more particularly concerns novel apparatus and techniques for coupling an electroacoustical transducer, such as a loudspeaker driver to a medium that propagates pressure waves, such as air, to significantly improve the base response of a pressure wave transducing system, such as a loudspeaker system, with relatively compact structure that is relatively easy and inexpensive to fabricate and operates with relatively high reliability and efficiency.

BACKGROUND OF THE INVENTION

Reference is made to Olney U.S. Pat. No. 2,031,500 disclosing a labyrinth loudspeaker design using an acoustic transmission line to eliminate cavity resonance, extend low frequency response and increase acoustic damping in cabinet type loudspeakers. This inventor taught tightly coupling the back of the loudspeaker cone to the end of a conduit lined with sound-absorbing material and opened at the far end. The patent discloses folding the conduit within the cabinet with the far open end located in the bottom of the cabinet. For a more detailed discussion of transmission line loudspeaker systems reference is made to the 1975 honors thesis of G. S. Letts entitled A STUDY OF TRANSMISSION LINE LOUDSPEAKER SYSTEMS available in Australia at The University of Sidney School of Electrical Engineering.

It is an important object of this invention to provide an improved acoustic transducer.

SUMMARY OF THE INVENTION

According to the invention, there are means defining at least first and second spaced openings, vibratile means for producing a pressure wave, and means for coupling one side of the vibratile means to the first opening and the other side of the vibratile means to the second opening. The first and second openings are spaced apart a predetermined distance close enough together so as to avoid decreased low frequency performance and far enough apart to prevent deep notches in the system frequency response at higher frequencies. A preferred separation is within the range of one-eighth to one times the length of the path for pressure waves between said vibratile means and the longer of such wave path distances between said vibratile means and said first and second openings. Preferably, the means coupling the vibratile means to at least one of the openings is pressure wave transmission line means of predetermined length for changing the pressure wave impedance match between said vibratile means and the medium adjacent said first and second openings, typically air. Preferably, the pressure wave transmission line means comprises a tube and said vibratile means comprises a diaphragm with the cross sectional area of said tube less than that of said diaphragm. Preferably the length of the tube between the diaphragm and the first opening is less than the length of the tube between the diaphragm and the second opening. Preferably, the input end of each tube is closely adjacent to the diaphragm. Preferably, a loudspeaker comprises the diaphragm and is characterized by a Bl product that coacts with the pressure wave impedance and length of the tubes to form a loudspeaker system having a frequency response that can be made substantially uniform over a relatively broad range of frequencies extending into the relatively deep bass through the use of equalization. The tube may be of rectangular cross section formed by staggered internal panels in a loudspeaker cabinet.

Numerous other features, objects and advantages of the invention will become apparent from the following specification when read in connection with the accompanying drawing in which:

DESCRIPTION OF THE PREFERRED EMBODIMENTS

Figure 1:
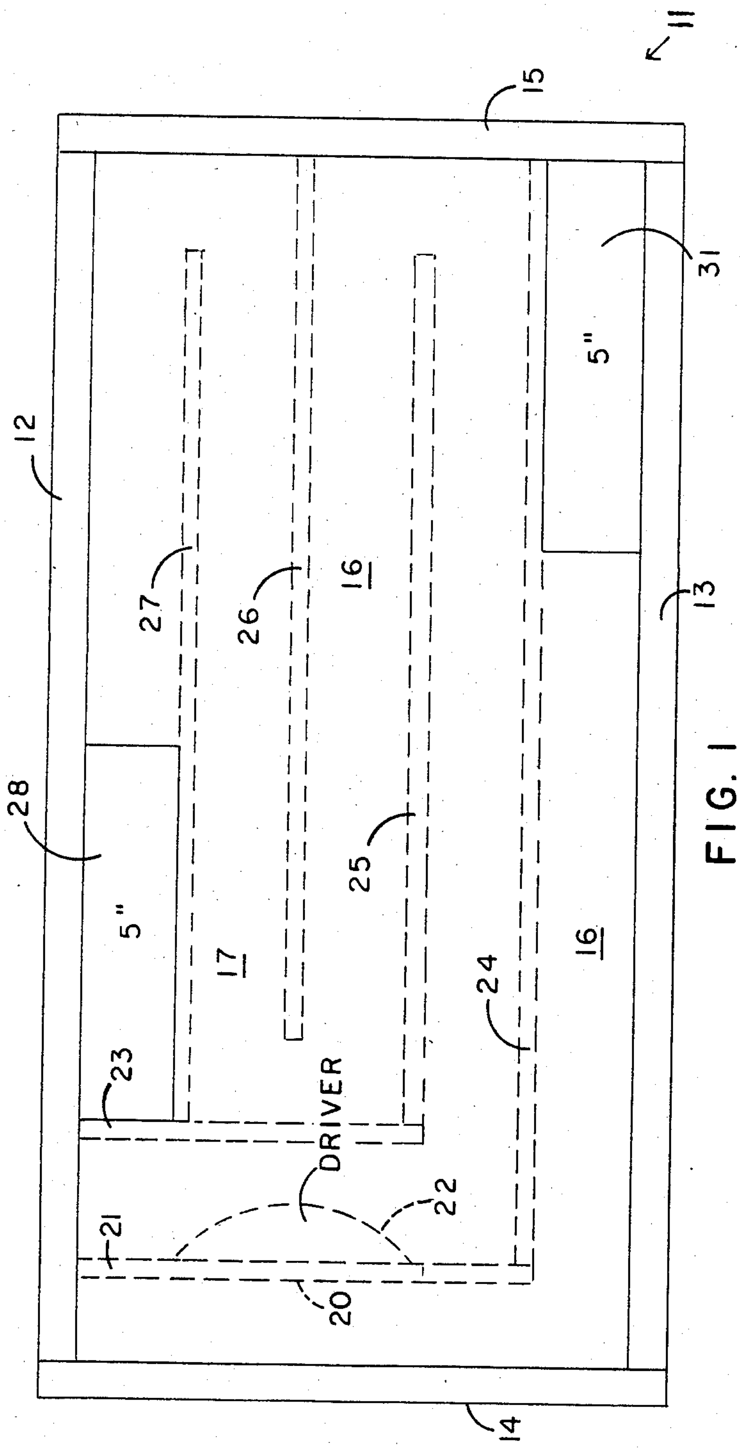
FIG. 1 is a front view of an embodiment of the invention that produces deep bass with a cabinet size sufficiently small to comprise a portable entertainment center.

With reference now to the drawing and more particularly FIG. 1 thereof, there is shown a front view of an embodiment of the invention. The loudspeaker system 11 is typically rectangular and includes top, bottom, side and front panels 12, 13, 14, 15 and 16, respectively. A vertical internal baffle 21 depends from top panel 12 and is formed with an opening 20 for accommodating loudspeaker driver 22, typically a 4½" driver of the type used in the commercially available BOSE 802 loudspeaker system. Loudspeaker driver 22 is seated between vertical panel 21 and a second vertical panel 23 that depends from top panel 12 to coact with internal horizontal staggered panels 24, 25, 26 and 27 in defining the rear tube of rectangular cross section extending between front panel 16 and the rear panel 17 coupling the rear of loudspeaker driver 22 to the top opening 28, typically of the same cross sectional area as that of the rectangular folded tube. The lowest panel 24 coacts with vertical panel 21 to form a front tube that couples the front of driver 22 to the opening 31 in front panel 16. Opening 31 is also of substantially the same cross sectional area as the right-angled rectangular tube between the front of driver 22 and opening 31. Although driver 22 may be full range, it may be advantageous to locate a tweeter on either side of the front panel with suitable crossover network means for directing high frequencies from left and right stereo channels to the tweeters to allow the compact cabinet to provide stereo sound reproduction.

The length of the longer tube between the rear of driver 22 and upper opening 28 is substantially three times the length of the shorter tube between the front of driver 22 and lower opening 31. The separation between openings 28 and 31 is of the order of half the length of the shorter tube between the front of driver 22 and opening 31. All the internal panels are hard so as to form high Q pressure wave or acoustic transmission lines between driver 22 and each of openings 28 and 31 so that large standing wave ratios may be established in these tubes. The invention effectively uses the tubes to couple the pressure wave of the loudspeaker driver to the outside air at openings 28 and 31 over a relatively broad frequency range extending into the deep bass to efficiently couple low frequency energy to the listening area at relatively high sound pressure levels with relatively little displacement of the diaphragm of driver 22 to help keep distortion very low. The tubes may be regarded as transmission line transformers having a transmission line medium characterized by an impedance and a length for reducing the mismatch between the vibratile diaphragm at one end and the impedance presented by the medium at the other end of the tube.

Having described the physical arrangement of an exemplary embodiment of the invention, the principles of operation will be described. Averaged over the useful bandwidth of the system the present invention provides a loudspeaker system with greater sensitivity than and with efficiency comparable to an identical loudspeaker driver in an infinite baffle or in a ported enclosure of the same volume by using acoustical transmission line characteristics to couple the acoustic output of the loudspeaker driver to the medium outside the cabinet. While prior art approaches using acoustic transmission lines generally teach the use of sound absorbing material to minimize resonance phenomena in the tube, according to the present invention the tube is preferably hard and free of sound absorbing material to take advantage of the resonance phenomena in the acoustic transmission line to achieve improved impedance match and thereby improve power transfer between the loudspeaker driver and the environment outside the cabinet.

Figure 2:
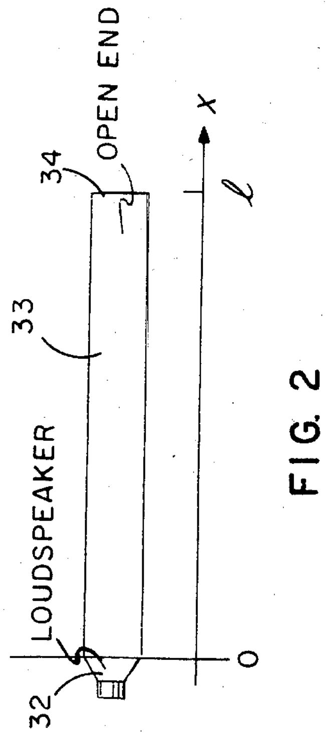
FIG. 2 is a diagrammatic representation of a loudspeaker driver at one end of a hollow hard tube acoustic transmission line.

Referring to FIG. 2, there is shown a diagrammatic representation of loudspeaker driver 32 at one end of a hard tube 33 having the same cross sectional area as that of the driver functioning as an acoustic transmission line of length l having an open end 34 that radiates waves launched at the other end by driver 32. In this first simplified analysis it is convenient to regard loudspeaker driver 32 as a velocity source. Because the acoustic impedance presented at open end 34 does not terminate acoustic transmission line 33 in its characteristic acoustic impedance, the pressure waves launched by driver 32 are reflected at the open end 34 to create standing waves inside tube 33. The boundary conditions for the ideal case are that the particle velocity at the source end of the tube ($x=0$) must match that of the loudspeaker driver source 32, and the incremental pressure at the open end of the tube ($x=l$) must equal zero. For a given driving frequency, the envelope of the resulting standing wave in the tube is sinusoidal with minima, maxima and relative phase dependent upon the length of the tube and the driving frequency.

Figure 3:
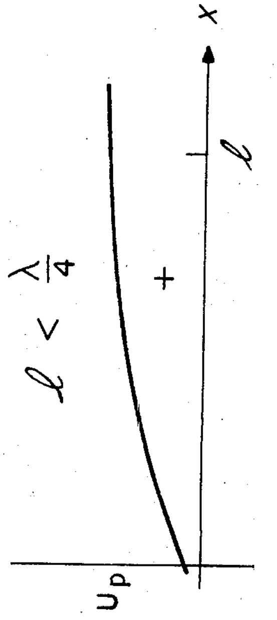
FIGS. 3–5 show standing wave patterns when the tube length is less than a quarter wavelength, between a quarter and half wavelength, and a half wavelength, respectively.
Figure 4:
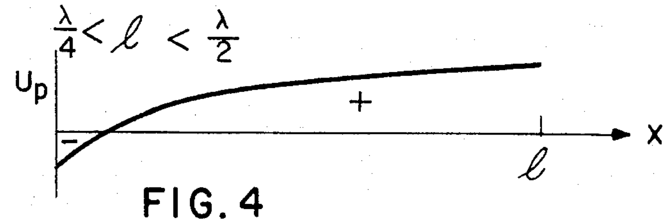
Figure 5:
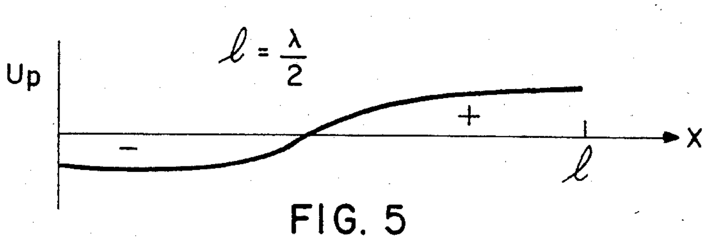

Referring to FIGS. 3, 4 and 5, there are shown velocity standing wave patterns when the tube length l at the driving frequency is less than a quarter wavelength, between a quarter and a half wavelength and a half wavelength, respectively. By tube length it is meant effective tube length including end effects. The + and − signs designate relative phases along the length of the tube. FIG. 3 shows that the particle velocity, $v_p$, at the open end 34 of tube 33 is much greater than the velocity of the driver 32 at the source end while the phase at both ends of the tube is the same. Increasing the driving frequency so that the tube length is slightly greater than one-quarter wavelength produces the standing wave pattern in FIG. 4. There is a velocity zero in the tube, and the particle velocity at the open end 34 of tube 33 is in phase opposition to the source velocity of driver 32. However, the open end velocity is still much greater than that of driver 32 at the source end. In this range of frequencies tube 33 produces a large velocity gain.

Increasing the driving frequency further where the length of tube 33 is a half wavelength at the driving frequency produces the standing wave pattern shown in FIG. 5. The particle velocity at the open end 34 has the same magnitude but opposite phase as the source velocity of driver 32. A further frequency increase toward the frequency where the tube length is ¾ wavelength produces results similar to that for the pattern of FIG. 3 except that the particle velocity at the open end 34 of tube 33 is in phase opposition to that of driver 32 at the source end. Increasing the driving frequency further to that for which the tube length is a wavelength results in the particle velocity at open end 34 of substantially the same magnitude and phase as that of driver 32 at the source end.

Tube 33 which functions as a low-loss acoustic transmission line provides a velocity gain and phase reversal that is periodic with frequency. For the ideal lossless case the gain is generally proportional to the secant of $(2\pi l)/\lambda$ where $\lambda$ is the wavelength of acoustic energy in tube 33 at the driving frequency.

In the embodiment of the invention shown in FIG. 1, the rear of driver 22 drives the rear tube, which couples upper opening 28 with driver 22. This rear tube is driven out of phase with the front of driver 22. In the absence of the front tube intercoupling the front of driver 22 with lower opening 31, in which case the front of driver 22 is exposed to the outside of the cabinet directly, the rear tube connecting the rear of driver 22 to upper opening 28 should introduce a phase reversal so that both the front of driver 22 and the open end 28 of the rear tube are in phase and add to work together in launching a wave of substantial energy in the listening area. This condition is met where the length of this rear tube is between one quarter and three quarters of a wavelength. At the frequency where the rear tube length is one half wavelength, the volume velocity at the front of driver 22 and the volume velocity at upper open end 28 are substantially equal in phase and magnitude, thereby providing a nominal 6 db increase in sensitivity compared to the same driver in the infinite baffle. At frequencies where the rear tube is one quarter or three quarters of a wavelength, the tube coupling driver 22 with open end 28 provides a substantial velocity gain to produce an even larger increase in the sensitivity of the loudspeaker system.

Immediately above the frequency for which the rear tube is three quarters of a wavelength long, the velocity at the front of driver 22 and the upper open end 28 are in phase opposition. As the frequency increases toward where the velocity gain imparted to the rear tube decreases toward unity, the front of driver 22 and upper opening 28 act like an acoustic dipole. At the frequency where the length of the rear tube coupling driver 22 with open end 28 is one wavelength, the front of the cone of driver 22 and the particle velocity at upper opening 28 have substantially the same magnitude but are in phase opposition to produce a minimum in the loudspeaker system response.

Figure 6:
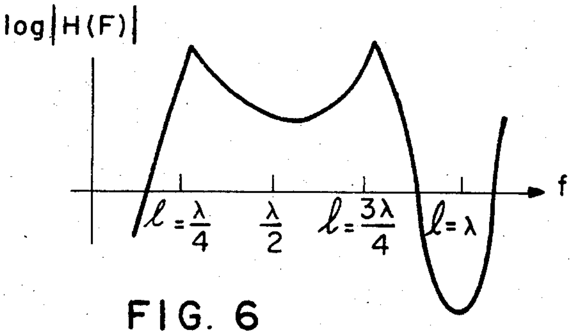
FIG. 6 illustrates the frequency response of a typical tube loudspeaker.

Referring to FIG. 6, there is shown the general form of response for a loudspeaker system driving a tube adjacent the rear surface of the cone of the loudspeaker driver. For a range of frequencies slightly greater than 3 to 1, a loudspeaker system with a single tube functioning as essentially a lossless acoustic transmission line provides substantial gain over a loudspeaker system consisting of the same loudspeaker driver in an infinite baffle.

Figure 7:
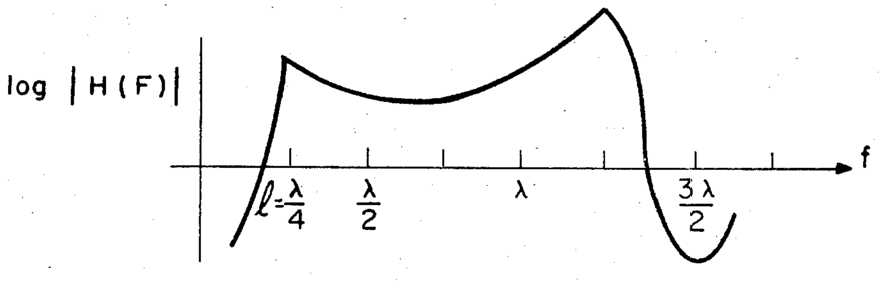
FIG. 7 shows frequency response as a function of frequency with the embodiment of FIG. 1.

Referring to FIG. 7, there is shown a graphical representation proportional to acoustical power output as a function of frequency with the embodiment of FIG. 1 having a front tube coupling the front of diaphragm 22 to lower opening 31. This arrangement fills in the notch for the frequencies in the region where the longer tube is one wavelength long. The front tube achieves this result by reversing the phase of the volume velocity contributed by the front of the cone of driver 22 in the range of frequencies for which the front tube is ¼ to ¾ of a wavelength long at the lower opening 31. An additional advantage is that this front tube also provides velocity gain so that the overall system sensitivity is greater than that with just the rear tube from the back of driver 22 to upper opening 28.

By making the front tube one-third the length of the rear tube, at the frequency where the rear tube is three-quarters wavelength, the front tube is a quarter wavelength, both tubes provides considerable gain, and both tubes introduce a phase reversal upon crossing that frequency. Thus, the output of both tubes continue to add in phase until the rear tube changes phase at the frequency where the rear tube is five-quarters of a wavelength long. The addition of the front tube thus increases the usable bandwidth of the two tube system relative to that of a one tube system by at least fifty percent. The null which results when both tubes have the same volume velocity magnitude and phase occurs at the frequency where the rear tube length is three halves of a wavelength.

The invention further takes advantage of a property that might ordinarily be regarded as disadvantageous. The acoustic impedance presented to the cone of loudspeaker driver 22 by each tube significantly loads the cone so that loudspeaker driver 22 is not the ideal velocity source assumed above in connection with the simplified analysis. Cone velocity at the frequencies where a tube has significant gain is considerably smaller than it would be if the driver were in an infinite baffle. Thus, cone displacement requirements are reduced compared to a similar speaker in an infinite baffle.

Tube gain is not as large as described above because while losses in the tube are maintained as low as practical, there is some loss in the tube, and the tube has some real component of the air load. It can be shown that the mechanical admittance of a lossless tube, defined as force divided by velocity, as seen by the cone of driver 22 is $$Y_T = Z_o\left(\frac{A_c}{A_T}\right)^2 A_T \frac{\exp(j\omega l/c) + \Gamma\exp(-j\omega l/c)}{\exp(j\omega l/c) - \Gamma\exp(-j\omega l/c)}$$

where $Z_o$ is the characteristic acoustic impedance of the tube, $A_c$ is the effective area of the cone of driver 22, $A_T$ is the cross sectional area of the tube, $\Gamma$ is the reflection coefficient at the open end 34 of the tube and c is the velocity of sound in the tube. Substituting a ratio of the area of the tube to that of the cone ($ATCR = A_T/A_c$) yields $$Y_T = Z_o\frac{A_c}{ATCR}\,\frac{\exp\frac{j\omega l}{c} + \Gamma\exp -\frac{j\omega l}{c}}{\exp\frac{j\omega l}{c} - \Gamma\exp -\frac{j\omega l}{c}}$$

Using a general loudspeaker model, the expression for cone velocity can be written as $$\frac{v_c}{E}(j\omega) = \frac{Bl}{R_e}\,\frac{1}{G + j\omega M_m + \frac{j(-1)}{\omega C_m} + Y_{T1} + Y_{T2}}$$

where $v_c$ is the cone velocity, E is the voltage applied to the voice coil of driver 22, Bl is the electrical to mechanical transformer turns ratio for driver 22 proportional to the magnetic flux density B in the voice coil gap and l the length of voice coil in the gap $G=(l/R_e/Bl^2))+(l/R_m)$ where $R_e$ is the voice coil resistance. $R_m$ is the mechanical responsiveness of the loudspeaker driver 22, $M_m$ is the mechanical mass of the voice coil and cone assembly and $C_m$ is the mechanical compliance of driver 22, and $Y_{T1}$ and $Y_{T2}$ are the admittances of the front and rear tubes, respectively, seen at the cone of driver 22 from the equation noted above.

Having discussed principles of operation, it is appropriate to consider choosing parameter values for practical systems. The longer the length l of tube 33, the lower the frequency at which the system response rolls off. Nominally, it is preferred that the effective tube length (which includes end effect) l be one-fourth the velocity of sound in the tube divided by the desired low end roll off frequency of the system. For a 60 Hz cutoff, that length is approximately 1.4 meters for an air-filled tube.

The distance S between the two tube openings 28 and 31 (or, for a single tube system, the distance between the loudspeaker cone and the tube opening), is preferably of the order of ⅓ to one times the length of the longer tube. If S is too small, then the null at the frequency where the longer tube length equals three halves of a wavelength (or equals one wavelength for a one tube only system) is very deep. By making S larger, the depth of this null can usually be made almost insignificant. However, if S is too great, the system response decreases at mid and low frequencies. In the embodiment of FIG. 1 openings 28 and 31 have been located as far apart as practical in the front panel of that system while still being sufficiently close to avoid significant deterioration of the response at middle and low frequencies.

For a given ratio of $(Bl)^2/R_e$ the ratio of tube to cone areas (ATCR) typically controls the size of the system response peaks at the frequencies where the tube length is an odd multiple of a quarter wavelength for a single tube. For some typical speakers and an ATCR of 1 these peaks are relatively large. For ATCR of 0.5, the system response is relatively smooth. For ATCR less than one half, system response decreases because the tube provides increased load on the loudspeaker cone.

It has been discovered that bends in the tube do not significantly alter system performance in the band of operation. The tube in the actual embodiment of FIG. 1 includes three 180° bends and one 90° bend. Sharp bends can be a source of turbulence which can be audible, but which do not significantly affect the in-band gain or performance of the system. Although sine wave excitation produces audible turbulence in the embodiment of FIG. 1, turbulence noise has not been heard with music excitation. It has also been discovered that the system response in the higher frequency region can be made more uniform by designing the folded tubes such that as many as practical of the straight segments are of different lengths.

It is also preferred that there be negligible compliance (air volume) between the loudspeaker driver cone and the tube. Thus, in the embodiment of FIG. 1 the cone of driver 22 forms a part of the wall of the tube coupling the cone to upper opening 28 and lower opening 31.

The free air resonant frequency of the loudspeaker driver may be chosen to be that at which the length of the longer of the tubes is a half wavelength and thereby lessen response irregularities that might be produced by resonances between reactive components of the loudspeaker driver and the tube. Preferably, the loudspeaker driver is overdamped to avoid undesired resonances between the loudspeaker and the tube.

Increasing the Bl product causes the peaks in response at the edge of the band (for which the tube length is an odd multiple of a quarter wavelength) to increase similar to the effect of increasing the ATCR. Thus, a low ATCR may be partially offset by using a higher Bl product. Furthermore, a higher Bl product decreases the sensitivity in midband where the length of the longer tube is a half wavelength. Preferably the Bl product is selected to help provide a more uniform response. For a given geometry of cone and tubes Bl is preferably selected such that the response at the frequency corresponding to $\lambda/4$ of the large tube is comparable to the response at the frequency corresponding to $\lambda/2$ of the large tube.

Figure 8:
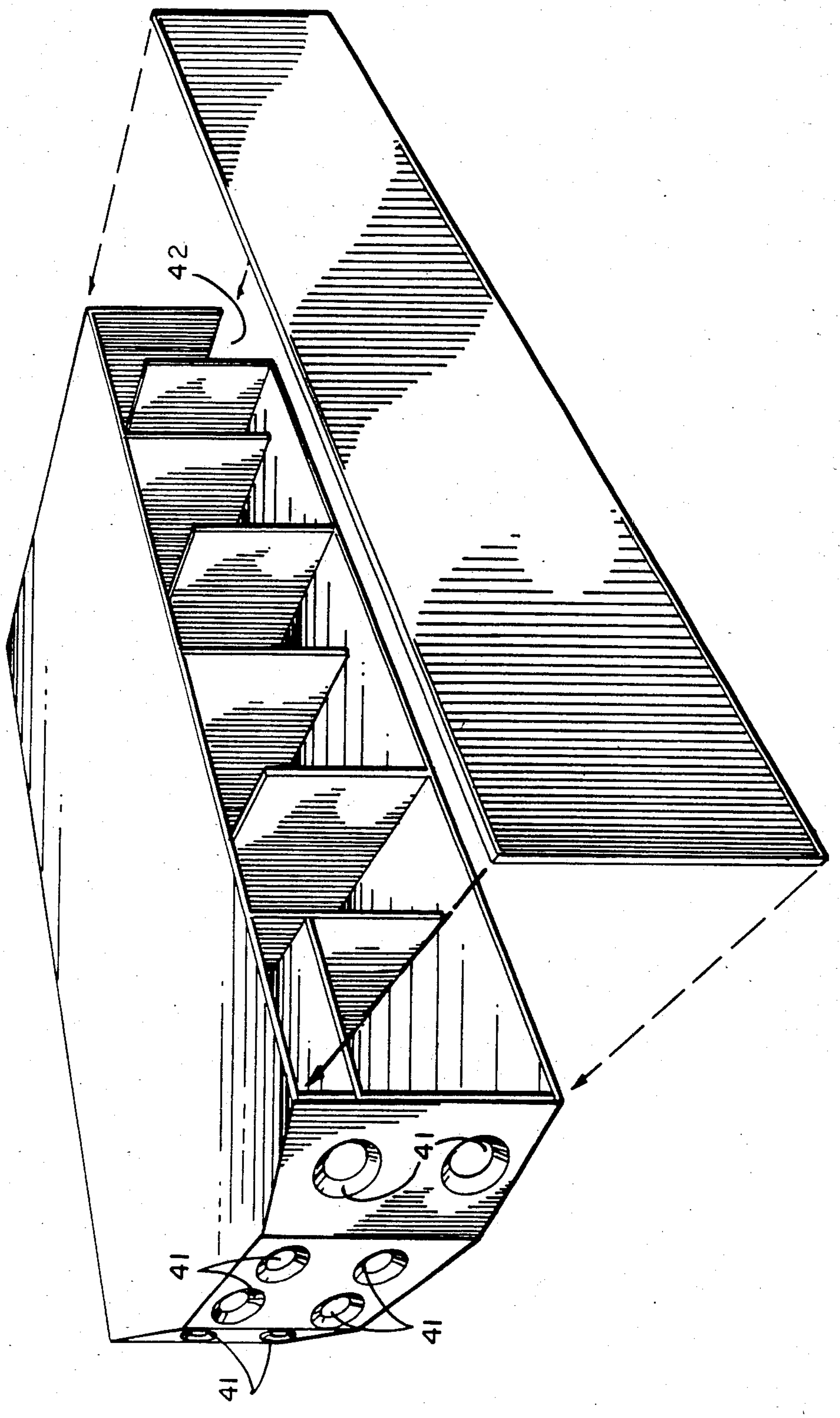
FIG. 8 is a diagrammatic representation of an embodiment of the invention suitable for use with a multiplicity of ike loudspeaker drivers in a cabinet.

Referring to FIG. 8, there is shown a diagrammatic representation of an embodiment of the invention using multiple drivers to provide a relatively large effective cone area. This embodiment is a modification of the BOSE 802 loudspeaker system having eight drivers on a front panel. This embodiment is a single tube unit having the rear of the cones of drivers 41 coupled by the folded tube of rectangular cross section to opening 42 at the rear. It may be advantageous to place one or more longitudinal vertical panels extending in a plane perpendicular to the front panel from the front panel partially or totally to the rear opening to provide isolation between drivers and prevent interaction in the case of driver unbalance whereby one or more of the drivers might be caused to move out of phase with the others. In an actual embodiment of the invention shown in FIG. 1 the cabinet is 17 inches wide by 8½ inches high by 6 inches deep, sufficiently small to be a cabinet for a portable cassette AM-FM receiver and sufficiently efficient to allow a 15 watt battery-operated power amplifier drive it using a singe 4½" driver of the type used in the BOSE 802 loudspeaker system with a pair of 3 inch tweeters, one at the left and one at the right fed separately above a crossover frequency of 500 hertz to provide stereo while radiating substantial bass without audible distortion. For this embodiment each of openings 28 and 31 were 5" wide and 1¼" high. Each of baffles 25, 26 and 27 extended from front to back and were 11½" long. Vertical baffles 21 and 23 were 6 and 4½ inches long, respectively. All external pieces were made of Lexan ½" thick and all internal baffles were made of ¼" PVC to provide an acoustic transmission line that is essentially lossless with hard walls that minimally deflect in response to the intense pressure peaks that may develop as a result of the standing waves in the tube.

Irregularities in the system response may be reduced with equalization circuitry to conform the overall system response to essentially any desired characteristic curve. It may be desirable to use equalization circuitry to insert a notch in the system response at a frequency below that for which the tube length is a quarter wavelength. The response of the tube loudspeaker system is low below this frequency. By locating equalization circuitry with this notch before the power amplifier driving the loudspeaker, the power amplifier does not deliver appreciable power to the speaker in this frequency band. This feature reduces power amplifier dissipation (and required capacity) and loudspeaker diaphragm displacement and distortion. This feature is useful for other loudspeakers, such as ported loudspeakers. That is to say, this feature is advantageous where both the front of the loudspeaker diaphragm and the rear of the loudspeaker diaphragm are exposed through passages or directly to the medium, such as air, in which the pressure waves are generated in response to vibration of the loudspeaker diaphragm. These passages may be acoustic waveguides as shown in FIG. 1, or ports or other passages.

Figure 9:
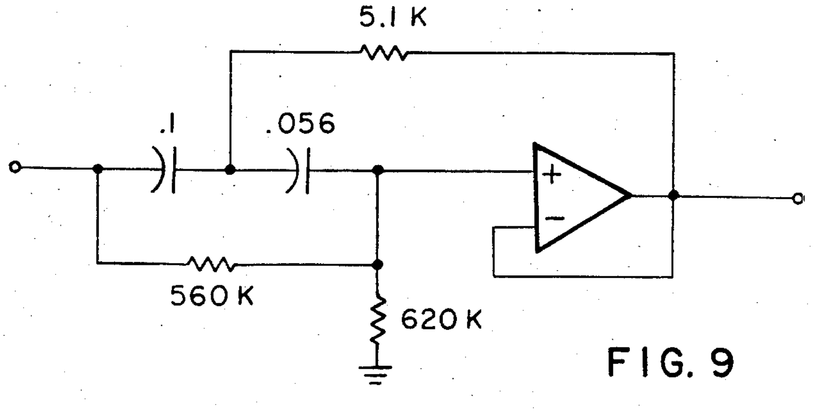
FIG. 9 is a schematic circuit diagram of notch circuitry.
Figure 10:
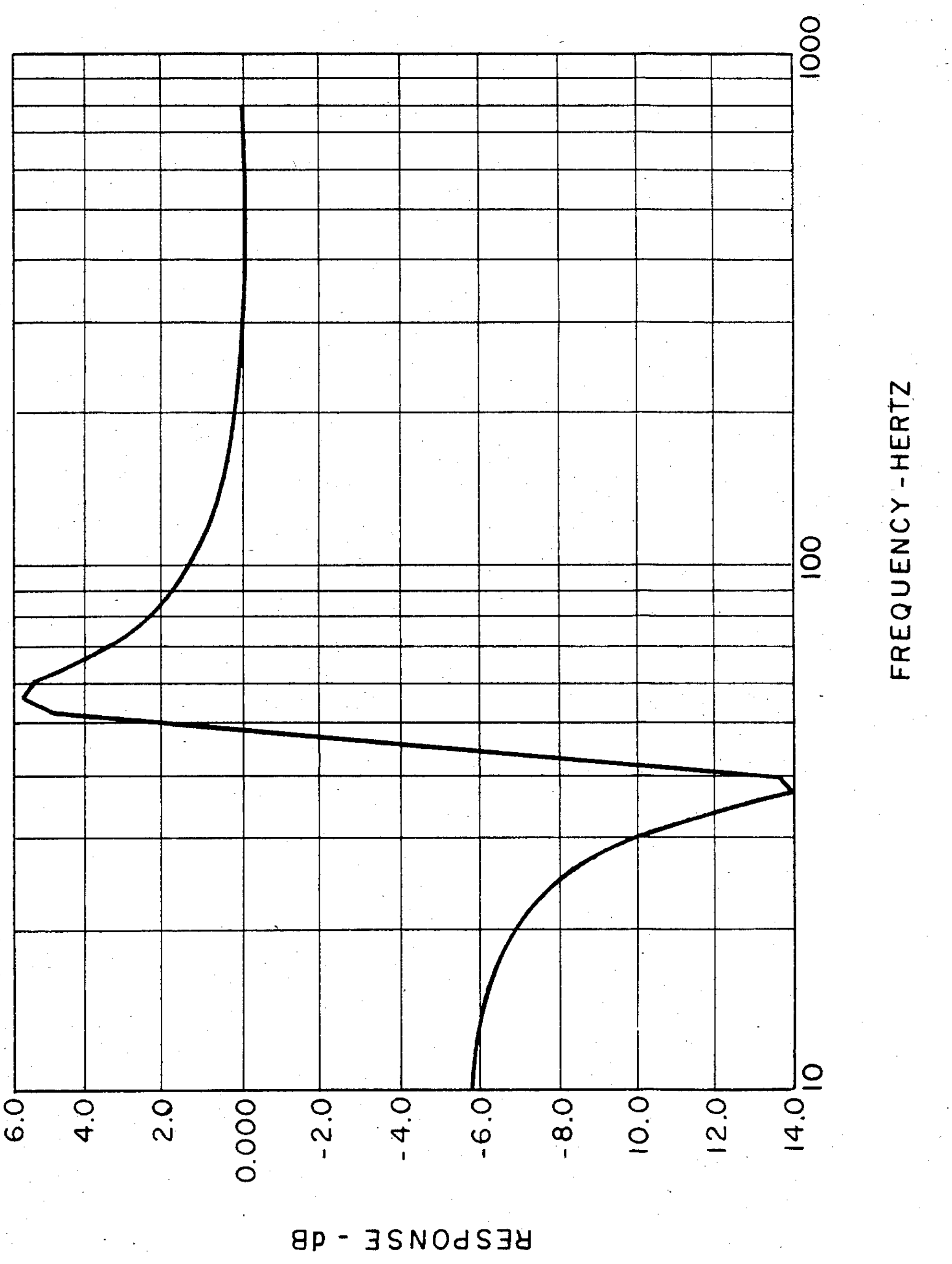
FIG. 10 is a graphical representation of the frequency response of the notch circuit of FIG. 9.
Figure 11:
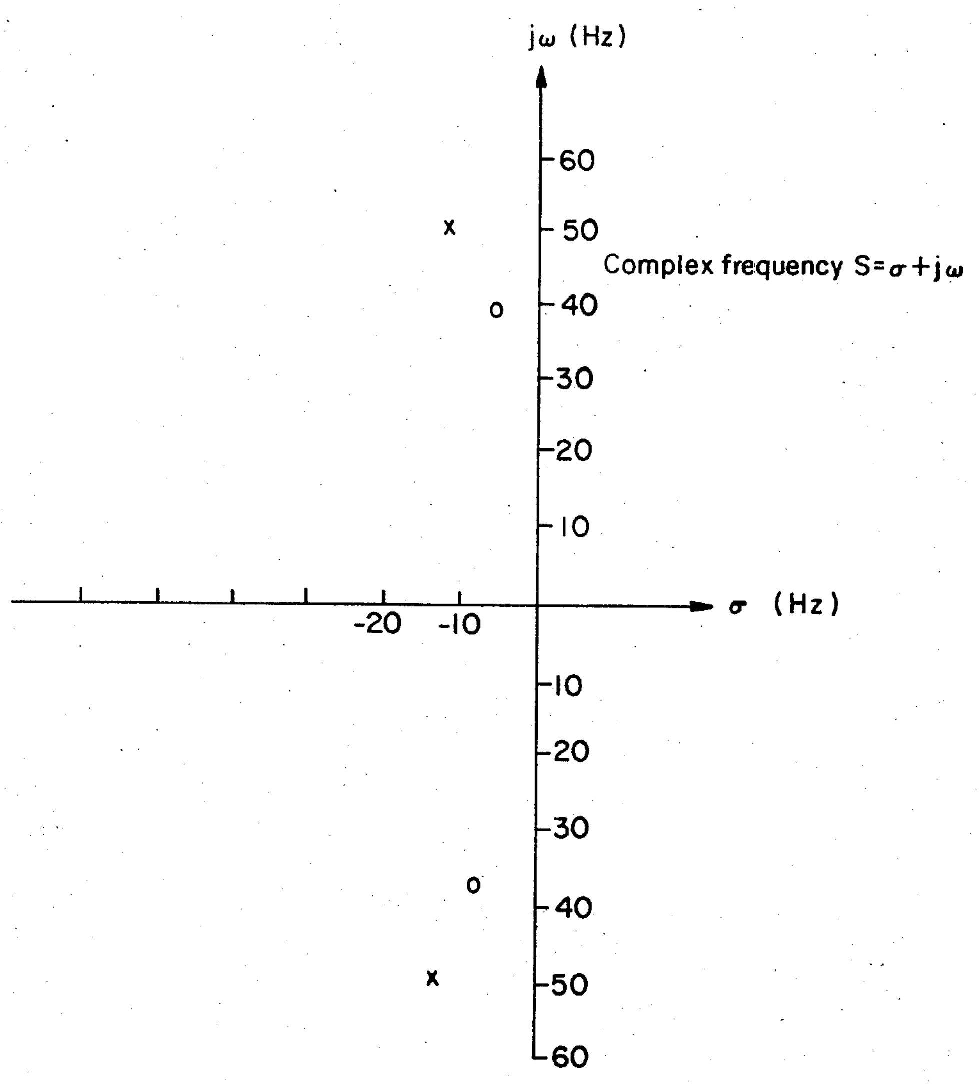
FIG. 11 shows the zero-pole pattern complex frequency plane of the notch circuit of FIG. 9.

Referring to FIG. 9 there is shown a schematic circuit diagram of an exemplary embodiment of a suitable notch circuit with specific parameter values. Referring to FIG. 10, there is shown the frequency response characteristic of the notch circuit of FIG. 9 with the notch frequency just below 40 Hz while there is substantial response at 50 Hz. The important feature of the circuit is to provide a sharp fall off in response just below the low cutoff frequency of the system and keeping the response relatively low in the frequency range below the low frequency cutoff frequency. Thus, circuitry which causes the response to drop by 6 decibels below the low frequency cutoff at the notch frequency would be satisfactory. Equalization circuitry having complex conjugate pole and zero pairs near the notch frequency could perform satisfactorily. FIG. 11 shows the complex conjugate pole and zero pairs in the complex frequency plane of the notch circuit of FIG. 9. In addition, this notch filter can be combined with other out-of-band rolloff filters to increase further its effectiveness.

As can be seen in FIG. 10, the notch frequency is at substantially 37 Hz while the cutoff frequency (the 3 dB down point in the response) is at substantially 47 Hz; that is to say, the notch frequency is of the order of one-third octave below the cutoff frequency, an octave above the notch frequency being substantially 37 Hz above the 37 Hz notch frequency.

While it is preferred to use equalization circuitry in the loudspeaker system according to the invention, the system may be built without electronic equalization. The parameters without electronic equalization would ordinarily be selected for optimum bandwidth without excessive variations. With electronic equalization, parameters would preferably be selected for a relatively smooth response over a relatively broad band, resulting in a system that would be relatively easy to equalize electronically to provide a substantially uniform response over a broad band.

There has been described novel apparatus and techniques for providing an economical improved loudspeaker system capable of faithfully and efficiently reproducing signals extending into the deep bass range with relatively compact structure that is relatively easy and inexpensive to fabricate. While the invention has been described specifically in connection with a loudspeaker system, the principles of the invention are applicable to other systems for coupling energy from or to a vibratile surface to a medium that propagates pressure waves. Thus, the principles of the invention are applicable to sonar and ultrasonic systems using vibratile surfaces coupled to or from a medium that propagates pressure waves and to microphones. It is evident that those skilled in the art may now take numerous uses and modifications of and departures from the specific embodiments and techniques described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. A system for transmitting pressure wave energy with a medium that propagates pressure waves comprising, transducing means having a vibratile surface for converting energy in one of pressure wave and electrical forms to the other, at least one low loss pressure wave transmission line means for transmitting energy between said medium and said vibratile surface, said pressure wave transmission line means having one end adjacent to said vibratile surface and the other end adjacent to said medium and an effective length corresponding substantially to a quarter wavelength at the lowest frequency of pressure wave energy to be transmitted between said medium and said vibratile surface.

2. A system in accordance with claim 1 and further comprising a second of said low loss pressure wave transmission line means having one end adjacent to said vibratile surface and the other end adjacent to said medium.

3. A system in accordance with claims 1 or 2 wherein said vibratile surface and said first medium are characterized by pressure wave impedances that ordinarily involve a mismatch therebetween and each of said low loss pressure wave transmission line means is characterized by a characteristic impedance and a length for efficiently coupling low frequency energy between said medium and said vibratile surface.

4. A system in accordance with claim 2 wherein said vibratile surface and said first medium are characterized by pressure wave impedances that ordinarily involve a mismatch therebetween and the length of the first-mentioned low loss pressure wave transmission line means is different from the length of said second low loss pressure wave transmission line means, whereby said first and second low loss pressure wave transmission line means coact to comprise means for efficiently coupling low frequency energy between said medium at the end of each transmission line means and said vibratile surface over a broader frequency range than either could effect alone.

5. A system in accordance with claim 4 wherein the length of said first low loss pressure wave transmission line means is substantially three times that of said second low loss pressure wave transmission line means.

6. A system in accordance with claim 1 wherein the distance between said one end and said other end is less than the length of said low loss pressure wave transmission line means and greater than the span across said vibratile surface.

7. A system in accordance with claim 1 wherein said low loss pressure wave transmission line means comprises a hollow tube with hard inside walls having a cross sectional area that is less than the area of said vibratile surface.

8. A system in accordance with claim 7 wherein the area of said vibratile surface is of the order of 1.5 to 2 times said cross sectional area.

9. A system in accordance with claim 1 wherein said medium is air and said low loss pressure wave transmission line means comprises a hollow tube with hard inside walls.

10. A system in accordance with claim 1 wherein said low loss transmission line means comprises first and second hollow tubes with hard inside walls separated by said vibratile surface.

11. A system in accordance with claim 9 wherein said tube comprises a plurality of overlapping sections connected in series between said vibratile surface and means defining an opening adjacent to said medium.

12. A system in accordance with claim 11 wherein said tube includes sections of different lengths.

13. A system in accordance with claim 10 wherein each of said tubes comprise a plurality of sections intercoupling said vibratile surface with means defining a first opening and means defining a second opening respectively with each of said tubes having sections of different length.

14. A system in accordance with claim 13 wherein said tubes comprise an enclosure having top, bottom, side, front and rear outside panels, a plurality of staggered generally parallel inside panels extending between said front panel and said rear panel, and an inside panel comprising both said first and second tubes and supporting said vibratile surface inside said enclosure.

15. A system in accordance with claim 14 and further comprising two of said side panels with one of said openings being in said front panel near the top thereof and closer to one of said side panels than the other and said second opening being in said front panel near the bottom thereof adjacent to said other side panel.

16. The improvement in accordance with claim 1 wherein said system is characterized by a low cutoff frequency below which low cutoff frequency said system does not produce appreciable output and further comprising, equalization circuitry for sharply reducing the system response below said low cutoff frequency.

17. A system in accordance with claim 16 wherein said equalization circuitry comprises a notch filter having a notch frequency that is closer to said cutoff frequency than to zero frequency.

18. A system in accordance with claim 17 wherein said notch frequency is of the order of one third octave below said cutoff frequency.

19. A system in accordance with claim 16 wherein said equalization circuitry includes means having a frequency response characteristic that imparts at least an attenuation of substantially 6 decibels to signals having spectral components at and below a predetermined notch frequency that is closer to said cutoff frequency than to zero frequency relative to signals having spectral components at and above said cutoff frequency.

20. A system in accordance with claim 18 wherein said circuit means is characterized by a pair of conjugate poles and conjugate zeros near said cutoff and notch frequencies respectively.

21. A system in accordance with claim 1 wherein said transducing means is a loudspeaker driver having a diaphragm comprising said vibratile surface.

22. A system in accordance with claim 21 and further comprising a second of said low loss pressure wave transmission line means having one end adjacent to said medium, said diaphragm separating the other end of said second of said low pressure wave transmission line means from an other end of the first-mentioned pressure wave transmission line means that has one end also adjacent to said medium.

23. A system in accordance with claim 21 wherein said loudspeaker driver and said medium are characterized by pressure wave impedances that ordinarily involve a mismatch therebetween and said low loss pressure wave transmission line means is characterized by a characteristic impedance and a length for efficiently coupling low frequency energy between said first medium and said loudspeaker driver.

24. A system in accordance with claim 22 wherein said loudspeaker driver and said medium are characterized by pressure wave impedances that ordinarily involve a mismatch therebetween and each of said low loss pressure wave transmission line means is characterized by a characteristic impedance and a length for efficiently coupling low frequency energy between said medium and said loudspeaker driver.

25. A system in accordance with claim 24 wherein the length of said first-mentioned low loss pressure wave transmission line means is different from the length of said second low loss pressure wave transmission line means, whereby said first-mentioned and second low loss pressure wave transmission line means coact to comprise means for efficiently coupling low frequency energy between said first medium at the other end of each transmission line means and said loudspeaker driver over a broader frequency range than either could effect alone.

26. A system in accordance with claim 25 wherein the length of said first-mentioned low loss pressure wave transmission line means is substantially three times that of said second low loss pressure wave transmission line means.

27. A system in accordance with claim 22 wherein the distance between said one end and said other end is less than the length of said first-mentioned low loss pressure wave transmission line means and greater than the span across said diaphragm.

28. A system in accordance with claim 21 wherein said low loss pressure wave transmission line means comprises a hollow tube with hard inside walls having a cross sectional area that is less than the area of said diaphragm.

29. A system in accordance with claim 28 wherein the area of said diaphragm is of the order of 1.5 to 2 times said cross-sectional area.

30. A system in accordance with claim 21 wherein said low loss transmission line means comprises first and second hollow tubes with hard inside walls separated by said loudspeaker driver.

31. A system in accordance with claim 28 wherein said hollow tube comprises a plurality of overlapping sections connected in series between said one and other ends.

32. A system in accordance with claim 30 wherein each of said tubes comprises a plurality of sections intercoupling said diaphragm with means defining a first opening and means defining a second opening respectively with each of said tubes having sections of different length.

33. A system in accordance with claim 32 wherein said first and second openings are separated by a distance greater than the span across each opening and less than the length of each section for coacting with said loudspeaker driver and said sections to provide a substantially uniform response over a relatively broad range of frequencies embracing the bass audio frequency range.

34. A system in accordance with claim 33 wherein the diameter of said diaphragm is of the order of 4.5 inches.

35. In a loudspeaker system characterized by a low bass cutoff frequency below which low bass cutoff frequency said system does not produce appreciable output sound energy including a vibratile surface and equalization circuit means for sharply reducing system response below said low bass cutoff frequency while maintaining system response in a passband above said low bass cutoff frequency the improvement comprising, notch filter means comprising said equalization circuit means and having a notch frequency that is closer to said low bass cutoff frequency than to zero frequency for helping sharply reduce the system response below said low bass cutoff frequency, said notch filter means comprising means for reducing audible distortion emanating from said vibratile surface and maintaining said system response from said notch frequency to zero frequency significantly below said system response in the passband.

36. The improvement in accordance with claim 35 wherein said notch frequency is of the order of one-third octave below said cutoff frequency.

37. The improvement in accordance with claim 35 wherein said equalization circuit means includes means having a frequency response characteristic that imparts at least an attenuation of substantially six decibels between signals at and above said cutoff frequency and frequencies at and below said predetermined notch frequency.

38. The improvement in accordance with claim 35 wherein said equalization circuit means is characterized by a pair of conjugate poles and conjugate zeros near said cutoff and notch frequencies.

39. The improvement in accordance with claim 35 wherein said vibratile surface comprises a loudspeaker diaphragm and said loudspeaker system produces pressure waves in a medium outside said system, and said loudspeaker system includes means for establishing communication between said medium and both the front and the rear of said loudspeaker diaphragm.

40. The improvement in accordance with claim 39 whrein said means for establishing communication comprises means defining a port.

41. The improvement in accordance with claim 39 wherein said means for establishing communication comprises first and second acoustic waveguides separated by said loudspeaker diaphragm.

* * * * *